United States Patent
Zhu et al.

(10) Patent No.: US 7,606,273 B2
(45) Date of Patent: Oct. 20, 2009

(54) WAVELENGTH AND INTENSITY STABILIZED LASER DIODE AND APPLICATION OF SAME TO PUMPING SOLID-STATE LASERS

(75) Inventors: Sheng-Bai Zhu, Fremont, CA (US); Ningyi Luo, Fremont, CA (US); Jing Yu, Milpitas, CA (US)

(73) Assignee: Pavilion Integration Corporation

( * ) Notice: Subject to any disclaimer, the term of this patent is extended or adjusted under 35 U.S.C. 154(b) by 80 days.

(21) Appl. No.: 11/872,642

(22) Filed: Oct. 15, 2007

(65) Prior Publication Data

US 2009/0097507 A1 Apr. 16, 2009

(51) Int. Cl.
*H01S 3/30* (2006.01)
*H01S 3/04* (2006.01)
*H01S 3/00* (2006.01)

(52) U.S. Cl. .................. 372/6; 372/29.011; 372/34; 372/38.02

(58) Field of Classification Search .............. 372/6, 372/29.011, 34, 38.02
See application file for complete search history.

(56) References Cited

U.S. PATENT DOCUMENTS

| | | | |
|---|---|---|---|
| 5,175,722 A | 12/1992 | Minami et al. |
| 5,197,059 A | 3/1993 | Minami et al. |
| 5,386,409 A | 1/1995 | Yokota et al. |
| 5,485,481 A | 1/1996 | Ventrudo et al. |
| 5,495,464 A | 2/1996 | Fujikawa et al. |
| 5,715,263 A | 2/1998 | Ventrudo et al. |
| 5,754,574 A | 5/1998 | Lofthouse-Zeis et al. |
| 5,856,994 A | 1/1999 | Hayakawa |
| 6,016,323 A | 1/2000 | Kafka et al. |
| 6,049,073 A | 4/2000 | Roddy et al. |
| 6,215,809 B1 | 4/2001 | Ziari et al. |
| 6,240,119 B1 | 5/2001 | Ventrudo |
| 6,292,498 B1 | 9/2001 | Pfaff |
| 6,385,219 B1 | 5/2002 | Sonoda |
| 6,418,154 B1 | 7/2002 | Kneip et al. |
| 6,525,872 B1 | 2/2003 | Ziari et al. |
| 6,584,127 B2 | 6/2003 | Matsumoto |
| 6,625,381 B2 | 9/2003 | Roddy et al. |
| 6,661,819 B1 | 12/2003 | Ventrudo et al. |
| 6,678,306 B1 | 1/2004 | Sonoda |
| 6,798,563 B2 | 9/2004 | Mailhot et al. |
| 6,807,206 B2 | 10/2004 | Tsukiji et al. |
| 6,882,666 B2 | 4/2005 | Kazarinov et al. |
| 6,914,872 B2 | 7/2005 | Tanaka |
| 6,922,423 B2 | 7/2005 | Thornton |
| 6,987,785 B2 | 1/2006 | Sakata et al. |
| 6,999,838 B2 | 2/2006 | Roddy et al. |
| 7,016,104 B2 | 3/2006 | Mao et al. |
| 7,031,359 B2 | 4/2006 | Satou et al. |

(Continued)

*Primary Examiner*—Armando Rodriguez

(57) ABSTRACT

An efficient and low-noise solid-state laser is optically pumped by one or more laser diode(s) driven by RF modulated current. The solid-state laser operation is stabilized by the pump source stable in both spectrum and intensity, in conjunction with automatic power control wherein the feedback loop accurately reflects the true drift in the output power. Moreover, the pump efficiency is optimized and the optical noise is minimized by adjusting the diode operation temperature such that the pump wavelength coincides with the absorption peak of the gain medium. By internally or externally modulating the amplitude of the drive current, the pump diode(s) operate in pulsed mode with controllable shape, width, repetition rate, and pulse-to-pulse intervals, which enables essentially constant optical energy produced from each pulse of the solid-state laser in high repetition rates with variable pulse-to-pulse intervals.

18 Claims, 14 Drawing Sheets

U.S. PATENT DOCUMENTS

| | | |
|---|---|---|
| 7,110,167 B2 | 9/2006 | Gurusami et al. |
| 7,167,490 B2 | 1/2007 | Mehuys et al. |
| 7,218,655 B2 | 5/2007 | Wang et al. |
| 2004/0207913 A1 | 10/2004 | Mehuys et al. |
| 2006/0018007 A1 | 1/2006 | Gurusami et al. |
| 2006/0039418 A1 | 2/2006 | Anikitchev et al. |
| 2006/0056470 A1 | 3/2006 | Liu et al. |
| 2006/0239323 A1 | 10/2006 | Montagne et al. |
| 2007/0008996 A1 | 1/2007 | Linville et al. |
| 2007/0064304 A1 | 3/2007 | Brennan, III et al. |
| 2007/0116075 A1 | 5/2007 | Fujita et al. |

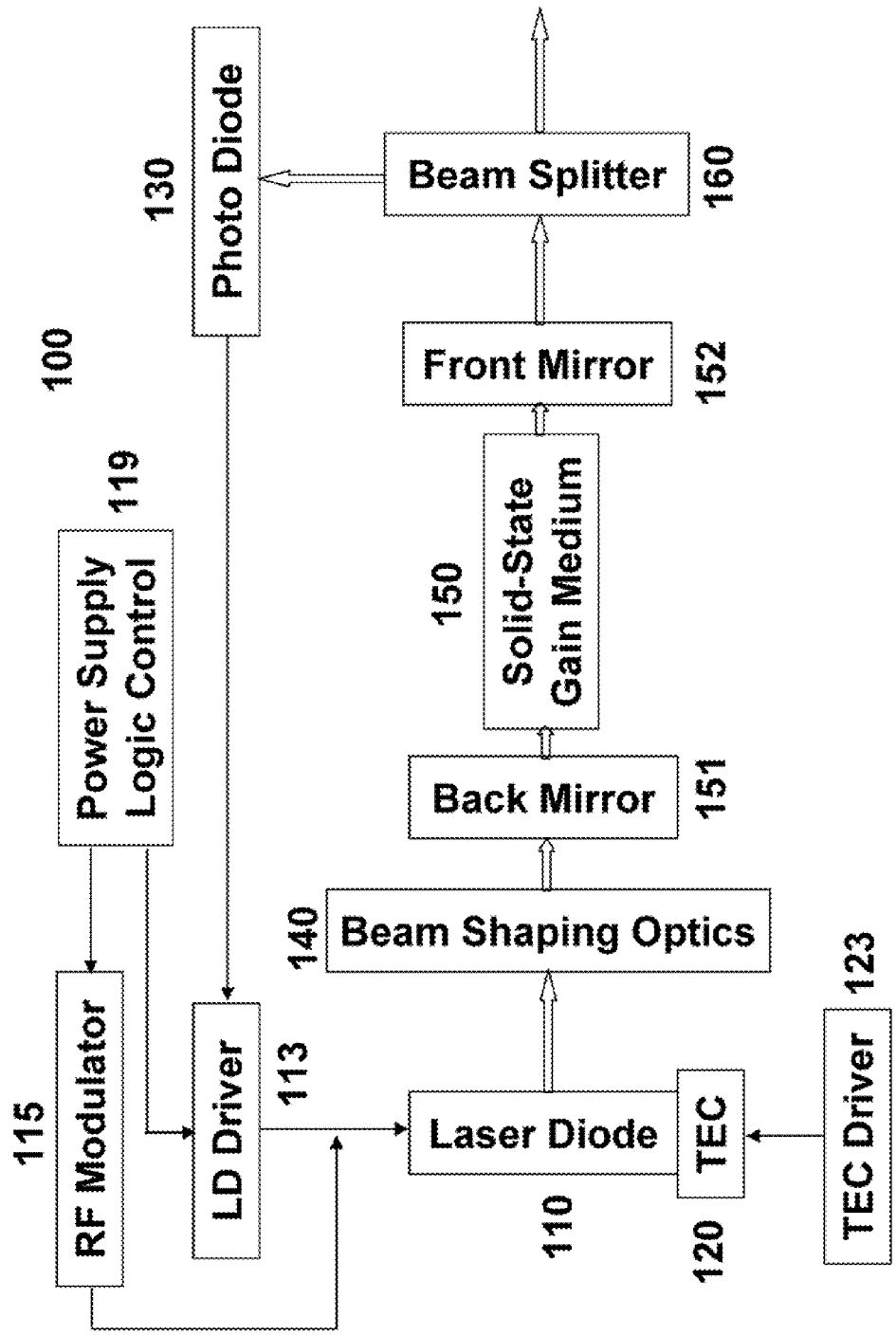

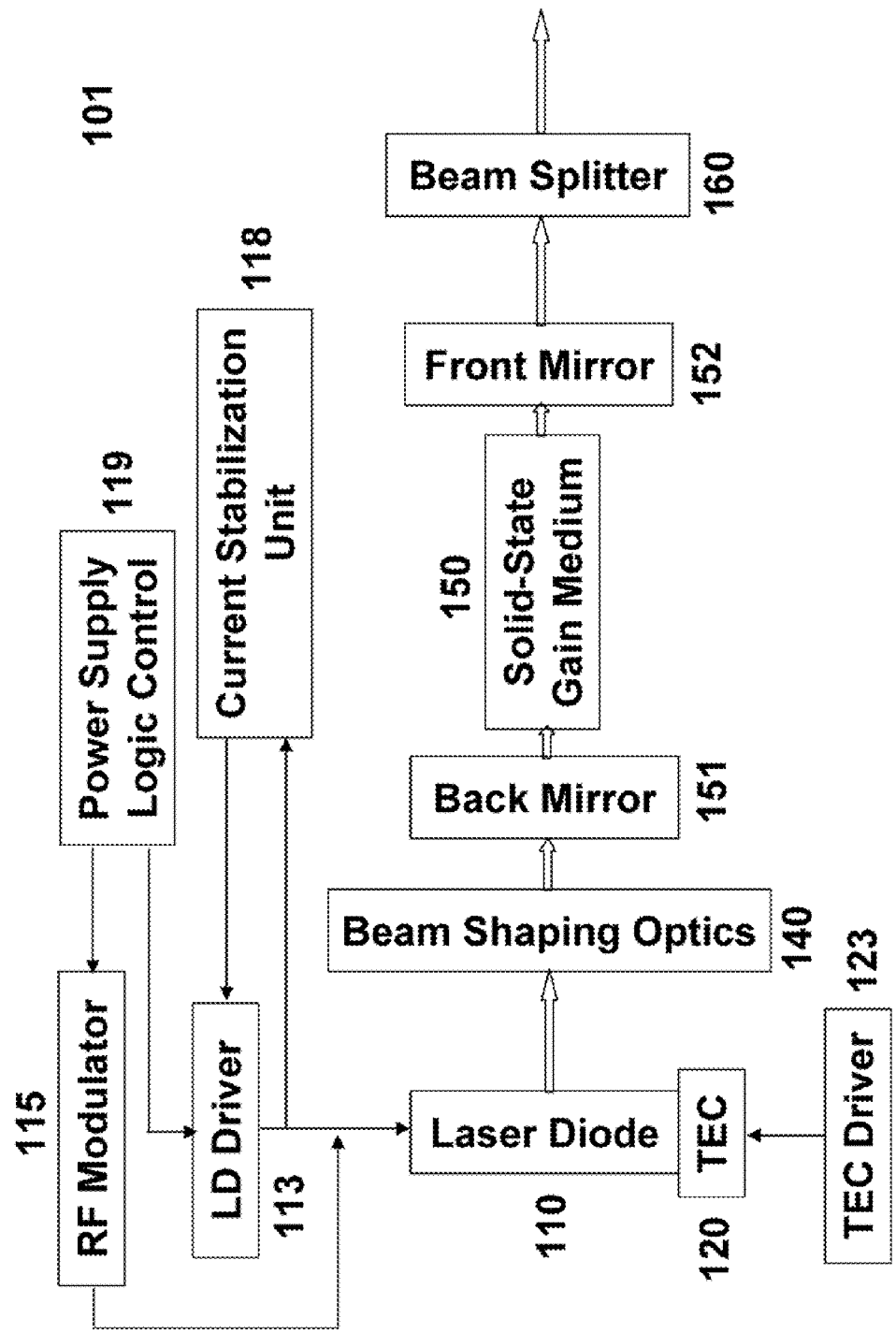

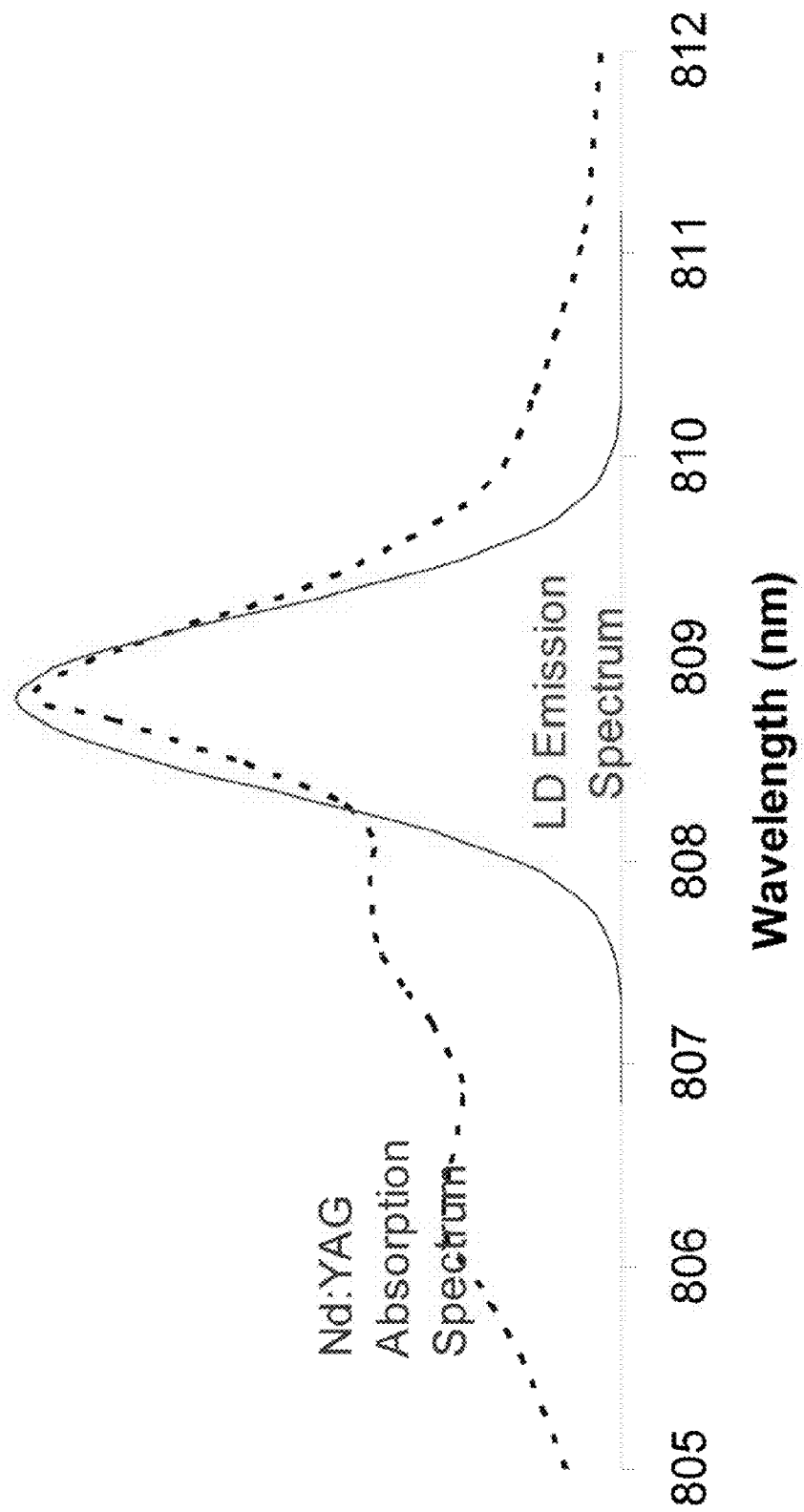

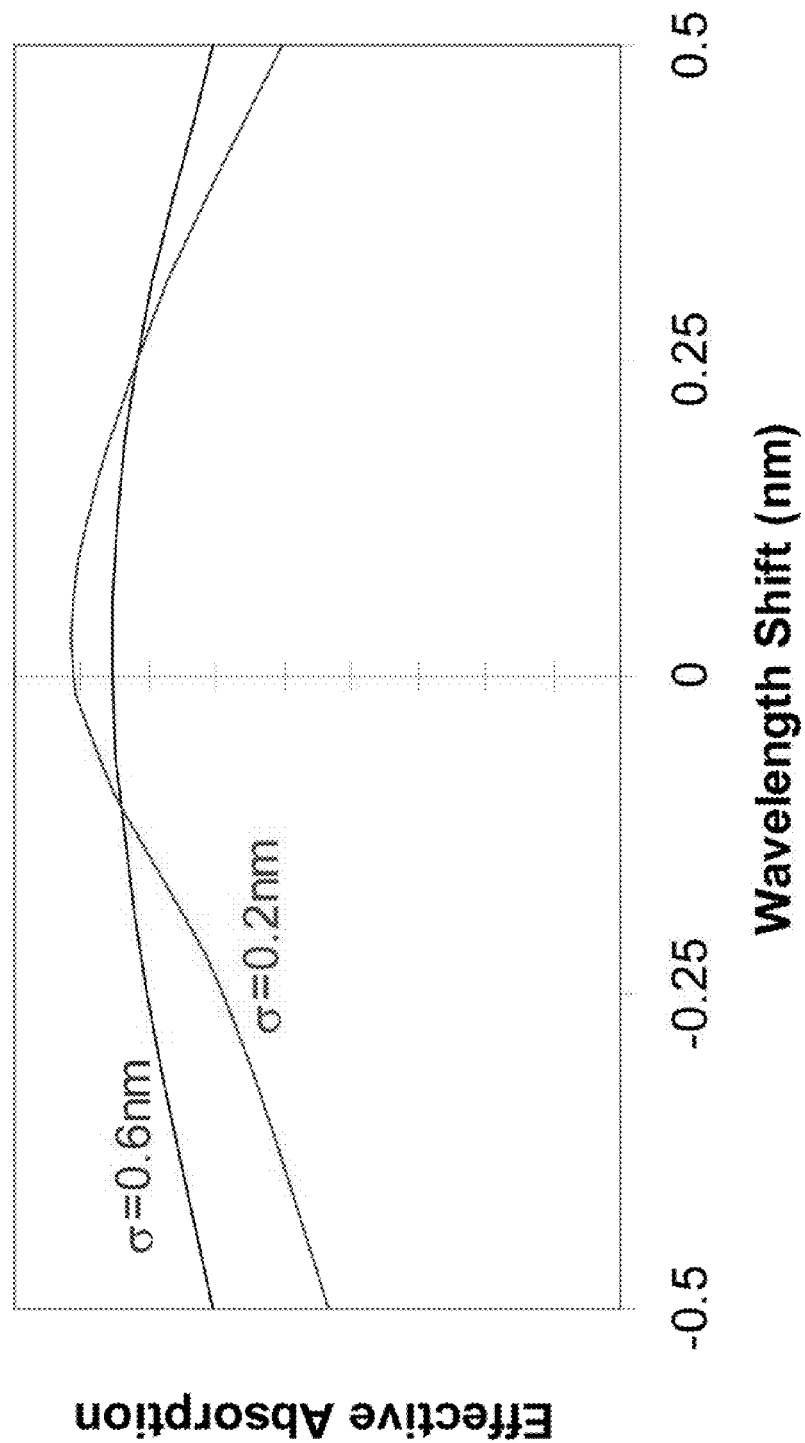

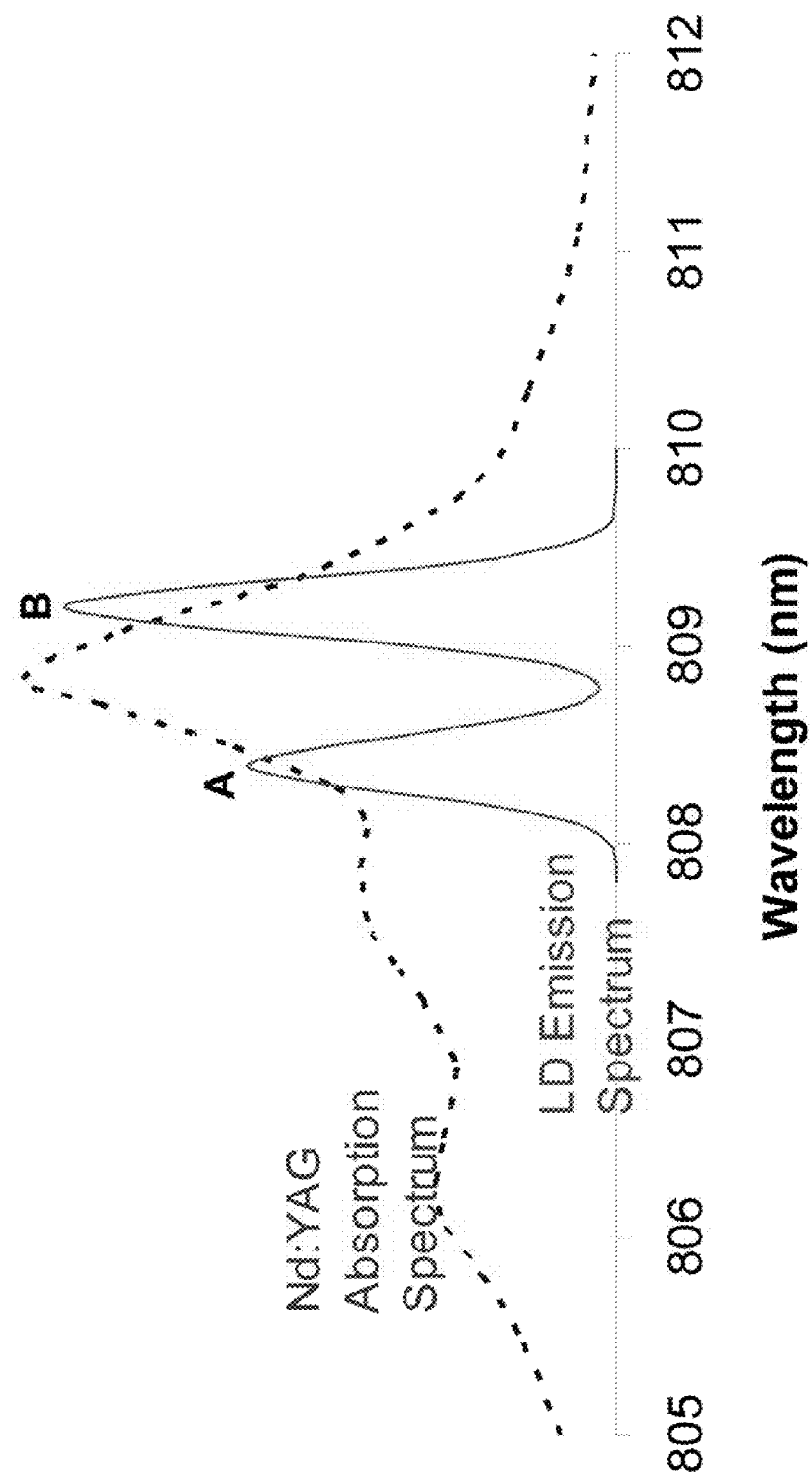

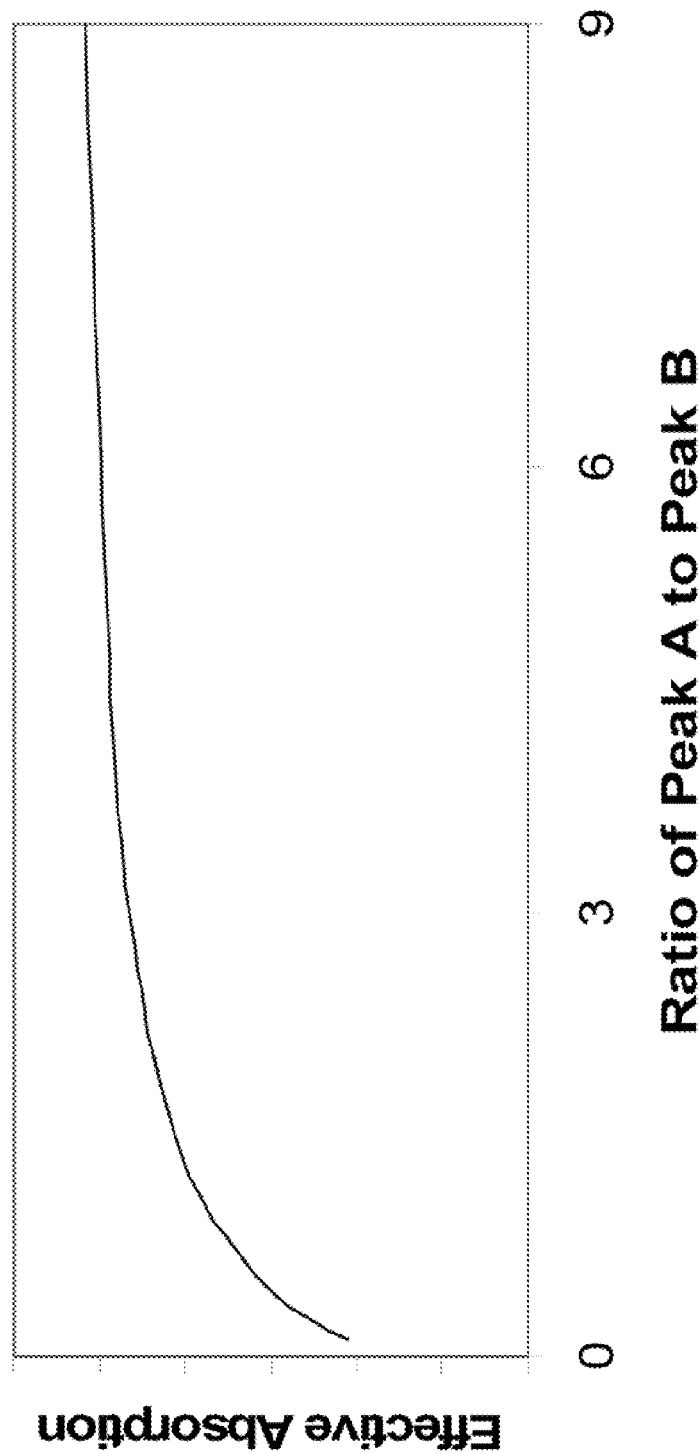

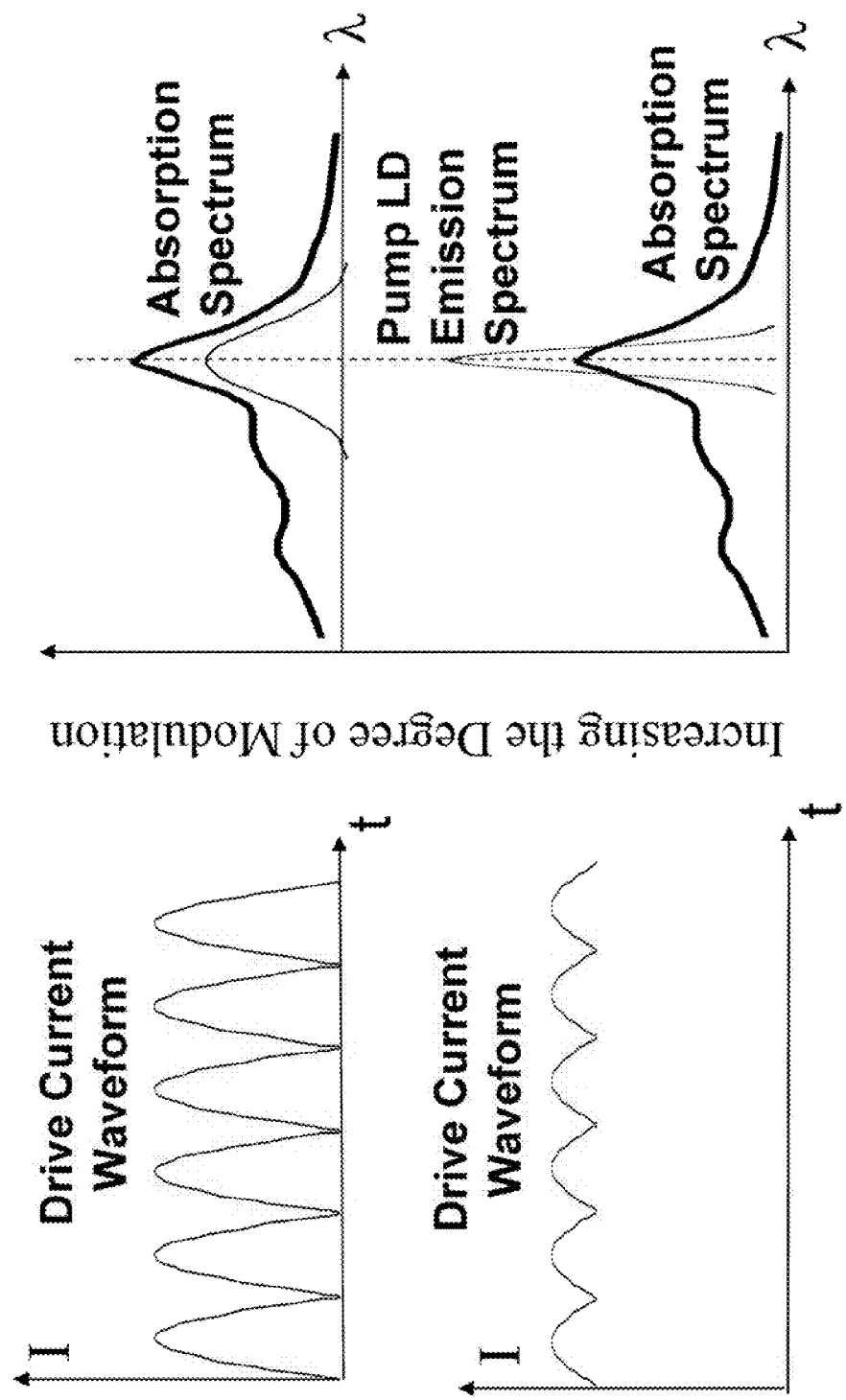

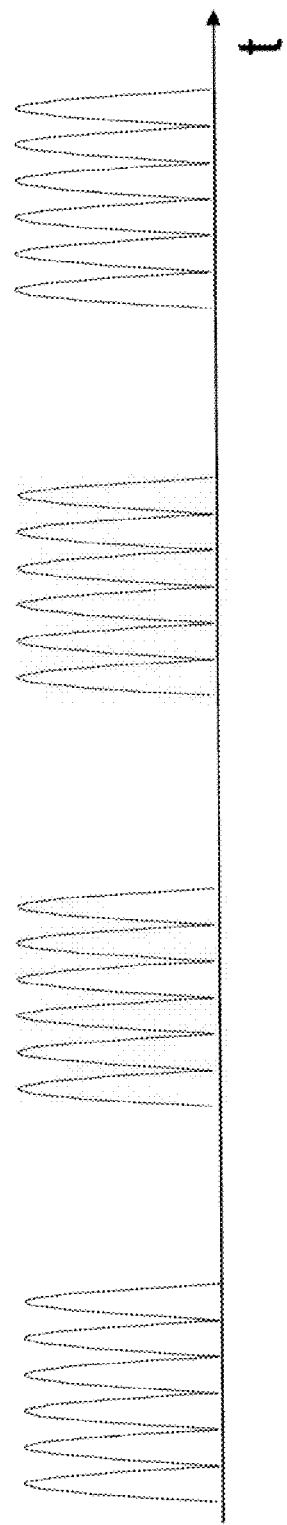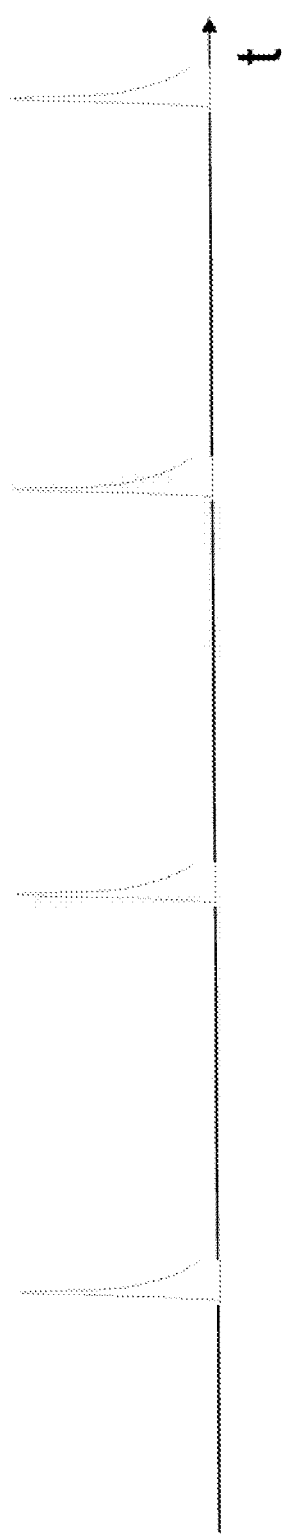
FIG 6
Drive Current Waveform
Gain Switched Pulse Train

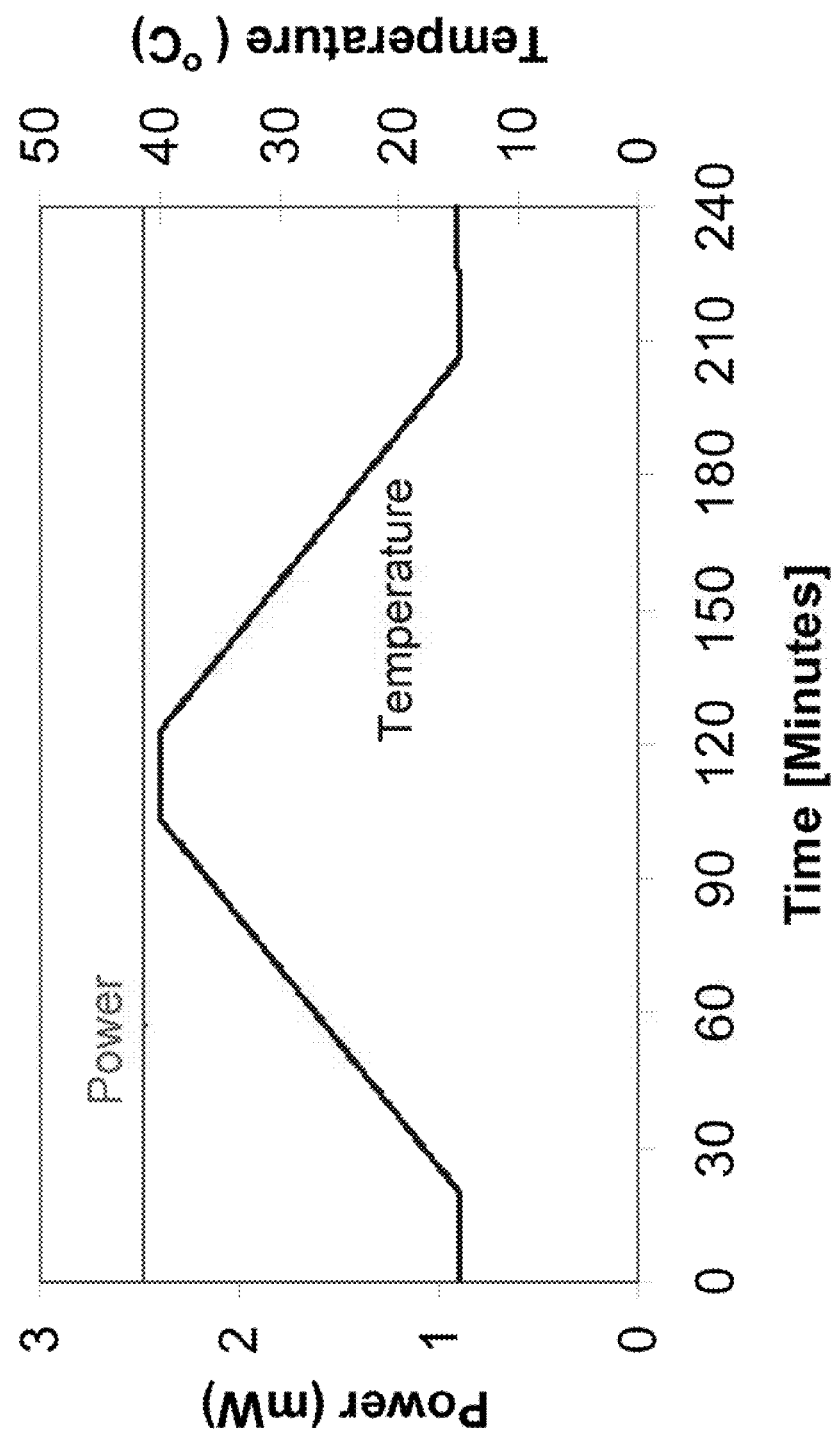

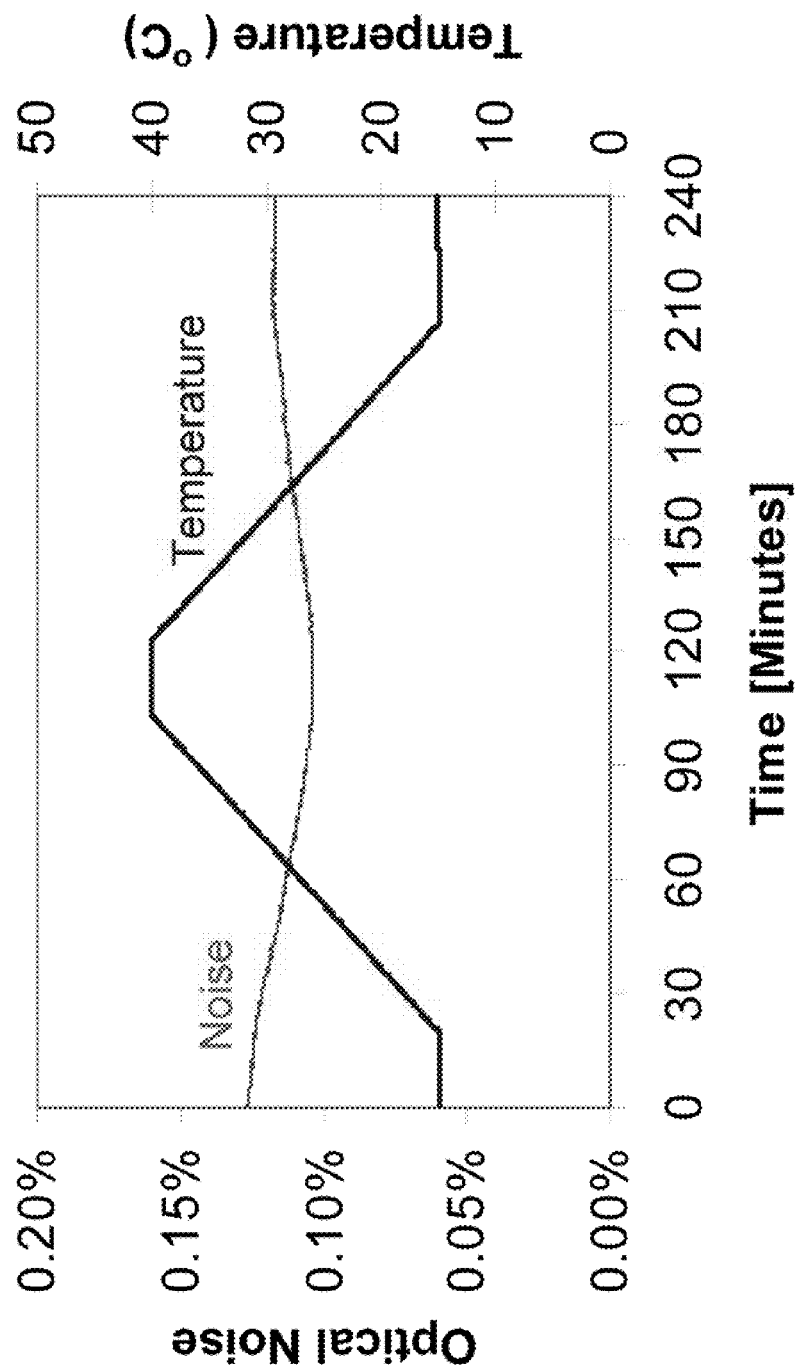

WAVELENGTH AND INTENSITY STABILIZED LASER DIODE AND APPLICATION OF SAME TO PUMPING SOLID-STATE LASERS

CROSS REFERENCE TO RELATED APPLICATION

This is a relation of U.S. Patent Publication No. 20060215716, filed Mar. 25, 2005, entitled, "Radio Frequency Modulation of Variable Degree and Automatic Power Control Using External Photodiode Sensor for Low-Noise Lasers of Various Wavelengths", which are hereby incorporated by reference in its entirety.

FIELD OF THE INVENTION

This invention relates in general to diode-pumped solid-state (DPSS) lasers, and, in particular to low-noise solid-state lasers pumped by one or more laser diode(s) employing radio frequency (RF) modulation and automatic power control for wavelength and intensity stabilization.

BACKGROUND OF THE INVENTION

In solid-state laser systems, activator/sensitizer ions present in a crystalline or glass host material or medium absorb light produced by an external pump source and thereby achieve an excited state to generate light at a known wavelength. The host laser medium is located in an optical cavity, which provides the optical feedback necessary for sustaining proper laser action.

The choice of the optical pump source to excite the laser medium strongly influences solid-state laser characteristics. Currently, semiconductor (diode) lasers are recognized as one of the most efficient pump sources to excite the laser medium. When employed as a pump source, the laser diode is used to generate light in a narrow spectral regime that overlaps the primary absorption band of the laser medium.

However, the performance of a laser diode is sensitive to the parameters such as operation temperature, driving current, optical feedback, and aging. When employed as a pump source, the fluctuations in the pump laser intensity and/or wavelength may destabilize the output power of the solid-state laser. Deviation of the operation temperature from the predetermined optimal level in just a few degrees or even less may cause significant mismatch of the pump wavelength and the gain medium absorption spectrum, resulting in dramatic drop of the DPSS laser efficiency. A further complication caused by the mismatch of the pump wavelength and the optimal absorption spectrum of the gain medium is that the unabsorbed pump light may interfere with the primary laser oscillation in the solid-state laser cavity. These problems are conventionally circumvented by maintaining the diode operation temperature precisely at a predetermined optimal level. In the prior art, optimal operation of laser diodes relies upon the inclusion of an automatic temperature controller such as thermal electric controller (TEC). One shortcoming of the automatic temperature controller is its ineffectiveness to fast fluctuations. Laser diodes that are used as pump source require excessive amounts of energy to operate. Effective heat sinks and/or water cooling are commonly employed. Consequently, the thermal control systems for pump diodes are typically large in size, complex in construction, and prone to failure.

What is more, even if the operation temperature is precisely maintained at a predetermined optimal level, the emitting wavelength of the laser diode drifts from the desired pump wavelength (optimal absorption wavelength of the laser gain medium) over time, due to the aging effect. For laser diodes that use light regulation loops for maintaining a constant laser output power, a runaway condition can occur as the diodes degrade over their lifetime. The runaway condition is most severe for pump diodes that require a high drive current and for gain media that have narrow absorption spectra. The prior art for DPSS laser monitoring and control includes U.S. Pat. No. 5,754,574, in which the diode temperature is controlled in accordance with the drive current to match the pump wavelength with the external cavity resonance; and U.S. Pat. No. 6,292,498, wherein the pump wavelength is monitored and controlled by employing a temperature modulation/detection technique. These methods are complicated and are ineffective in prevention of instable operation of the solid-state laser caused by pump light mode hopping, mode partitioning, and/or noise due to unwanted optical feedback.

Unwanted optical feedback occurs when the stray light reflected from the surfaces of the solid-state lasing gain medium and other optical elements in the laser cavity enters a photon-to-electron conversion device such as photodiode. Unwanted optical feedback may deteriorate the linear relationship between the drive current and the laser output, which has an impact on the automatic power control and even causes parasitical oscillation. To improve the linearity of the drive current vs. laser output, a method was disclosed in U.S. Pat. No. 5,856,994, wherein an index-guided type multi-transverse mode broad area laser having a single optical waveguide was used as the pump source.

One approach to stabilization of DPSS laser output relies on single longitudinal mode (SLM) operation via a wavelength selector disposed in the solid-state laser resonator. However, by absorbing a laser beam, temperature of the wavelength selector increases, which may alter the selected wavelength, causing mode hop. Global temperature control in the resonator is ineffective because the temperature rise is local, near the optical axis of the wavelength selector.

Another approach to stabilization of DPSS laser output relies on SLM pump diode. In order to maintain the laser diode in SLM and mode-hop free operation, a conventional method is based on phase coherence through, e.g., an external laser cavity in conjunction with wavelength-selective feedback from grating or externally coupled cavity. Such laser diode systems usually have relatively large sizes, high costs, less robustness, and require of sophisticated laser current and temperature control. As a matter of fact, employing a highly coherent light as pump source is not necessary or even not preferred. Another inherent drawback of the method relates to its ineffectiveness when the pass band of the wavelength selection element is broader than the interval between two adjacent wavelengths of the laser diode Fabry-Perot modes.

A more attractive strategy is based on the opposite philosophy, i.e., intentional decrease of the pump laser coherence, so that phase related optical noise can be washed out.

Apparatus and methods that employ a fiber Bragg grating (FBG) to stabilize the intensity and wavelength of a pigtailed laser diode were disclosed by a number of inventors. As described in U.S. Pat. Nos. 5,485,481, 5,715,263, 6,525,872, and 6,661,819, a fiber Bragg grating is placed in the output of the laser source with a separation sufficient to cause the laser source to operate in the "coherence collapse" regime. Consequently, the laser diode is forced to operate in multiple longitudinal modes, while the central wavelength is locked by the fiber grating to its maximum reflectivity. However, problems related to packaging and polarization significantly limit the usefulness of this method. In addition, the use of FBG for laser stabilization imposes tight manufacturing specifications on parameters such as front facet reflectivity and laser wavelength control.

A different scheme to address stabilization of laser diodes that are employed for pumping solid-state lasers or fiber amplifiers/lasers was investigated by Ziari et al. In U.S. Pat. No. 6,215,809. By the use of a dither circuit, which causes a small and continuous variation of the drive current, coherence collapse is achieved and the laser source is repeatedly perturbed from one operating mode to another at a rate that is too high for the solid-state gain element to response. In the U.S. Pat. No. 6,240,119 issued to Ventrudo, kink-free operation was achieved by repetitive switching between the states of coherence and coherence collapse through variations of the drive current amplitude at a rate considerably higher than the reciprocal of the relaxation time of the excited state of the optical gain medium, which is typically from several microseconds to milliseconds. This technique, however, is ineffective when the laser operation current is close to the critical current at which transition from coherence to coherence collapse occurs.

Stabilization of laser diode operation can also be achieved by RF modulation. With this method, the drive current changes rapidly and continuously in such a way that there is no particular longitudinal mode preferable. In other words, the laser diode operates in a multimode spectrum, normally containing a large number of longitudinal modes. Although the intensity of each individual mode fluctuates all the time, the averaged output essentially keeps unchanged and the overall optical noise decreases significantly.

There have been a number of attempts at controlling laser drive current based on high frequency, e.g. RF, modulation. In such control systems, the drive current is loaded to the high frequency signal generated by a local oscillator so that the superposed current periodically crosses the threshold level. Below this level, the laser diode is off. When the current exceeds the threshold, the laser turns on again. With repeated on-off operation at high frequency, the laser diode operates in multiple modes because there is not enough time for the completion of mode competition. As a consequence, the signal-to-noise ratio at low laser output can be improved. In fact, there have been several investigations on the application of RF stabilization to optical data reading/writing systems. Exemplary disclosures can be found in U.S. Pat. Nos. 5,175,722; 5,197,059; 5,386,409; 5,495,464; and in particular U.S. Pat. No. 6,049,073. In the last reference, laser output of approximately 20 to 100 mW has been obtained with the use of RF injection. Unfortunately, due to the sine waveform of the RF drive current, this type of stabilization schemes allows only 50% duty cycle. It is not suitable to high power laser diodes such as those used as pump sources because this would overdrive the laser and decrease its lifetime. In extreme cases, there is a possibility for the power supply to back-bias the laser diode and even destroy it.

In an attempt to extend the above-discussed RF stabilization scheme to high power region, Roddy and Markis, in U.S. Pat. Nos. 6,625,381 and 6,999,838, have invented a control system, which allows a laser diode to operate predominantly above the threshold. Specifically, the injection circuit generates a radio frequency waveform, which provides a drive current that varies between the point slightly below a lasing threshold and a level above a DC bias point. Since the drive current is asymmetric about the DC bias, a duty cycle, which is greater than 50%, can be achieved. Therefore, a high average laser output power can be obtained without the risk of exceeding the maximum rated current, $I_{max}$. Unfortunately, the RF waveforms generated from their inventive system are ineffective to certain devices, where operation modes cannot be refreshed unless the drive current periodically passes through a level that is far below the lasing threshold to completely turn off the laser and eliminate the memory in each RF cycle. Therefore, the prior art fails to stabilize lasing operation of the gain media, which employ such devices as the pump source.

Application of RF modulation to second harmonic generation (SHG) is described in, e.g., U.S. Pat. No. 6,678,306 issued to Sonoda. Dependence of the SHG efficiency on the modulation frequency and degree were investigated. Because the degree of modulation adopted by Sonoda was rather deep, the bandwidth of the primary laser spectrum was wider than the phase matching tolerance. Consequently, an external oscillator including a narrowband filter for wavelength selection was used in order to realize the quasi-phase matching of the SHG.

In another work, as disclosed in U.S. Pat. No. 6,385,219, Sonoda has investigated an index-guided laser diode, which is modulated by an electrical signal with a frequency of 20 MHz or higher and a percentage modulation between 50% and 100% (peak-to-peak normalized to two times the DC component). The laser diode emits a light with multiple transverse modes for optically pumping a solid-state laser medium. One disadvantage of the method invented by Sonoda is that optical noise increases dramatically as the percentage modulation reaches 50% or below. Another disadvantage of his invention is associated with the low duty cycle of the modulation current: increasing the percentage modulation implies increasing the peak drive current to keep the output power at the required level. When the percentage modulation is or close to 100%, the peak drive current becomes twice of the average value (the DC bias), which may cause the laser diode be deteriorated or failed. This is particularly problematic for pump diodes, normally requiring high output power. Another limitation of his invention is that the waveform of the drive current modulation may not provide the best spectral match for some gain media, in particular those with sharp absorption peak. In addition, the method disclosed by Sonoda is ineffective to gain-guided laser diodes, which normally require a higher threshold current.

There are applications, where the pump power is dynamically controlled to a level near the threshold or a coherent collapse regime. The solid-state laser operation then is very sensitive to optical noise. In the prior art, stabilization of the solid-state laser operation near the threshold is achieved by a pulse-width modulated pump source. For example, U.S. Pat. No. 7,110,167 describes an optical amplifier system, in which the pump source operates in a pulsed mode and the pulse amplitude is above the threshold current level and also above the critical current level associated with the coherent collapse regime. The pulse width is adjustable so as to produce an average power that matches a predetermined set point. One or more fiber Bragg gratings are employed for optical coupling between the pump laser diode and the optical gain medium. In addition to amplitude modulation and pulse width modulation, the laser diode can also be modulated by the repetition rate of pulses.

In spite of these efforts, a large room for further improvement of laser stabilization still remains to be filled. In particular, the stabilization methods of the prior art are subject to variations in the environmental conditions and are not applicable to certain laser diodes, normally having a high threshold, therefore, a relatively narrow range of operating current, and/or strong Amplified Spontaneous Emission (ASE), and/or mode-partition related noise. In order to refresh the laser oscillation modes in these laser diodes, the drive current must periodically drop to a level far below the threshold to completely turn off the laser operation and eliminate the memory. The successes in stabilizing DPSS lasers and fiber lasers are very limited. To date, the RF modulation, as described in the prior art, produces only broadband, multimode laser output. Because of this limitation, the prior art has not been very successful in applications requiring stable narrowband or single longitudinal mode laser sources. Examples of such applications include high-order harmonic generation, Raman scattering, and optical activation of gain media with a sharply peaked absorption spectrum. Moreover, the prior art has not disclosed the critical role of appropriately selecting the laser operation parameters. As a result, optical noise associated with mode hop and/or mode partition may still occur.

The invention disclosed in U.S. Patent Publication No. 20060215716 advantageously addresses these deficiencies and enables relatively compact and low-cost high power solid-state lasers, which can be operated stably and reliably at various wavelengths, from near infrared to the entire range of visible, in single or multiple mode(s). With one or more nonlinear optical processes, the solid-state lasers can also produce shorter wavelength lasers including UV and DUV.

SUMMARY OF THE INVENTION

As a continuation of the U.S. Patent Publication No. 20060215716, the present invention discloses a method and an apparatus, wherein the wavelength and spectrum stabilized laser diode module is applied to optically activating a solid-state laser in order to produce stable and reliable laser output.

According to our invention, wavelength and spectrum stabilized laser operation is achieved by improved automatic power control system and RF modulation, i.e., intentional change of laser drive current at a high frequency. As the drive current varies, the wavelength of the light emitted from the laser diode changes, resulting in a continuously swept spectrum in one RF cycle. Averaged over time, the laser spectrum is broadened and smoothened.

According to our invention, the laser drive current is modulated by a sine wave or a rectified sine wave or other waves, or is superimposed by a series of narrow pulses with negative polarity, or is repetitively shunted at a radio frequency. Advantageously, the degree of RF modulation can be optimized to meet the requirements for best performance of the solid-state laser. In particular, the effective absorption of the pump energy in the gain medium, whether in continuous mode or pulsed mode, can be maximized, while photon-induced heat is minimized. Moreover, the modulation waveform is preferably of high duty cycle (ratio of the average power to the peak power) to deliver sufficient pump energy without the risk of overdriving the laser.

According to our invention, the automatic optical power control consists of laser output monitoring, photon-electron conversion, and a feedback loop to adjust the bias based on the detected signal. With the inventive structure, the photodiode accepts only a fraction of the light from the output coupler of the solid-state laser, which eliminates perturbations from any stray lights. Instabilities associated with unwanted optical feedback and changes in environmental conditions such as temperature thus can be remedied.

According to our invention, stable DC bias in conjunction with temperature control through, e.g. thermoelectric controller, can be employed, as an alternative to the automatic power control system, for pump diode wavelength and intensity stabilization. Stable DC bias can be obtained by a current feedback loop. This stabilization scheme does not use photodiode sensor.

According to our invention, laser noise associated with mode hop due to temperature variation is completely eliminated. High frequency intensity fluctuation of individual modes cannot be detected by photodiodes characteristic of slow response. Only slow signals, which represent true drifts in the laser output power rather than hops in laser modes, are fed back into the control circuit to make appropriate adjustments of the current supplied to the laser. Because the laser emits a stable and smooth spectrum, problems related to variations in optical surface reflectivity, which is generally wavelength-sensitive, are essentially solved. Warm-up or equilibration time is no longer required.

According to our invention, the RF modulated laser diode can be operated in pulsed mode of various shapes, widths, and repetition rates via internal or external modulation, which can be achieved electronically or optically. Pulsed solid-state laser operation can be achieved by Q-switching or gain switching.

According to our invention, one or more wavelength stabilized laser diode(s) can be employed for end pump or side pump. When multiple pump diodes are used, these light sources can be operated in any combinations that lead to the optimized performance or specially required performance of the pumped solid-state laser.

Compared with the prior art, the present invention exhibits several important advantages.

In one aspect, the inventive automatic power control loop is less perturbed by fluctuations in the temperature. In addition, it effectively suppresses detrimental effects from unwanted optical feedback, which is an important noise source for laser diodes, laser diode pumped solid-state lasers or fiber amplifiers/lasers or thin-disk lasers, and seed lasers, with or without nonlinear frequency conversion processes.

In another aspect, the inventive RF modulator is capable of stabilizing various types of laser diodes including those to which the prior art is ineffective. This offers more available wavelengths for the pump purpose. The prior art has not been successful for stabilizing laser diodes with high threshold and, therefore, a relatively narrow range of operating current, and/or strong ASE, and/or mode-partition related noise. In order to refresh the lasing modes in each RF cycle, the drive current must drop to such a level that the laser operation is completely turned off and the memory is eliminated.

In another aspect, the inventive RF modulator is capable of stabilizing laser diodes operated at high power, in CW or pulsed mode. Pulsed operation of the laser diode can be realized by internal or external modulation, electro-optically or electronically. With our inventive teachings, rapidly pulsed low-noise sold-state laser operation is enabled. In particular, the pulse repetition rate can be variable while the energy per pulse remains constant. This requirement can not be met by a Q-switched laser operating at a repetition rate higher than the reciprocal of the characteristic time of the gain medium, because the energy per pulse then reduces as the repetition rate increases.

In yet another aspect, adjusting the laser diode static operation parameters so that the central wavelength of the pump light matches with the peak of the absorption spectrum of the gain medium and selecting the degree of RF modulation to optimize the energy conversion (maximize the effective absorption of the pump energy while minimize photon-induced heat) in the gain medium, which, together with the inventive noise reduction and mode-hop elimination schemes, enable efficient, stable and reliable DPSS laser output.

The invention, as well as its objects and advantages, will become more apparent from the drawings and detailed description presented hereinafter.

BRIEF DESCRIPTION OF THE DRAWINGS

FIG. 1A is a functional block diagram of a diode pumped solid-state laser stabilized by the inventive method;

FIG. 1B is another functional block diagram of a diode pumped solid-state laser stabilized by the inventive method;

FIG. 2A shows a stabilized laser diode emission spectrum that matches with the absorption spectrum of Nd:YAG gain medium;

FIG. 2B shows the effective absorption of optical energy as a function of the pump wavelength shift;

FIG. 3A compares the absorption spectrum of Nd:YAG gain medium with a laser diode emission spectrum that suffers mode-partitioning;

FIG. 3B shows the effective absorption of optical energy as a function of the intensity ratio of the two branches in the pump laser spectrum;

FIG. 5C shows a scheme to optimize the effective absorption of pump energy by adjusting the pump spectrum bandwidth, which can be realized by appropriate selection of the drive current waveform or the degree of the RF modulation according to our inventive teaching;

FIG. 6 is a conceptual illustration of a gain-switched solid-state laser activated by a rapidly pulsed pump diode constructed according to the present invention.

FIG. 7A shows the power stability test result of a green laser module constructed in accordance with the present invention.

FIG. 7B shows full-time low noise operation of the green laser module.

DETAILED DESCRIPTION OF THE PRESENT INVENTION

Figure 1C:
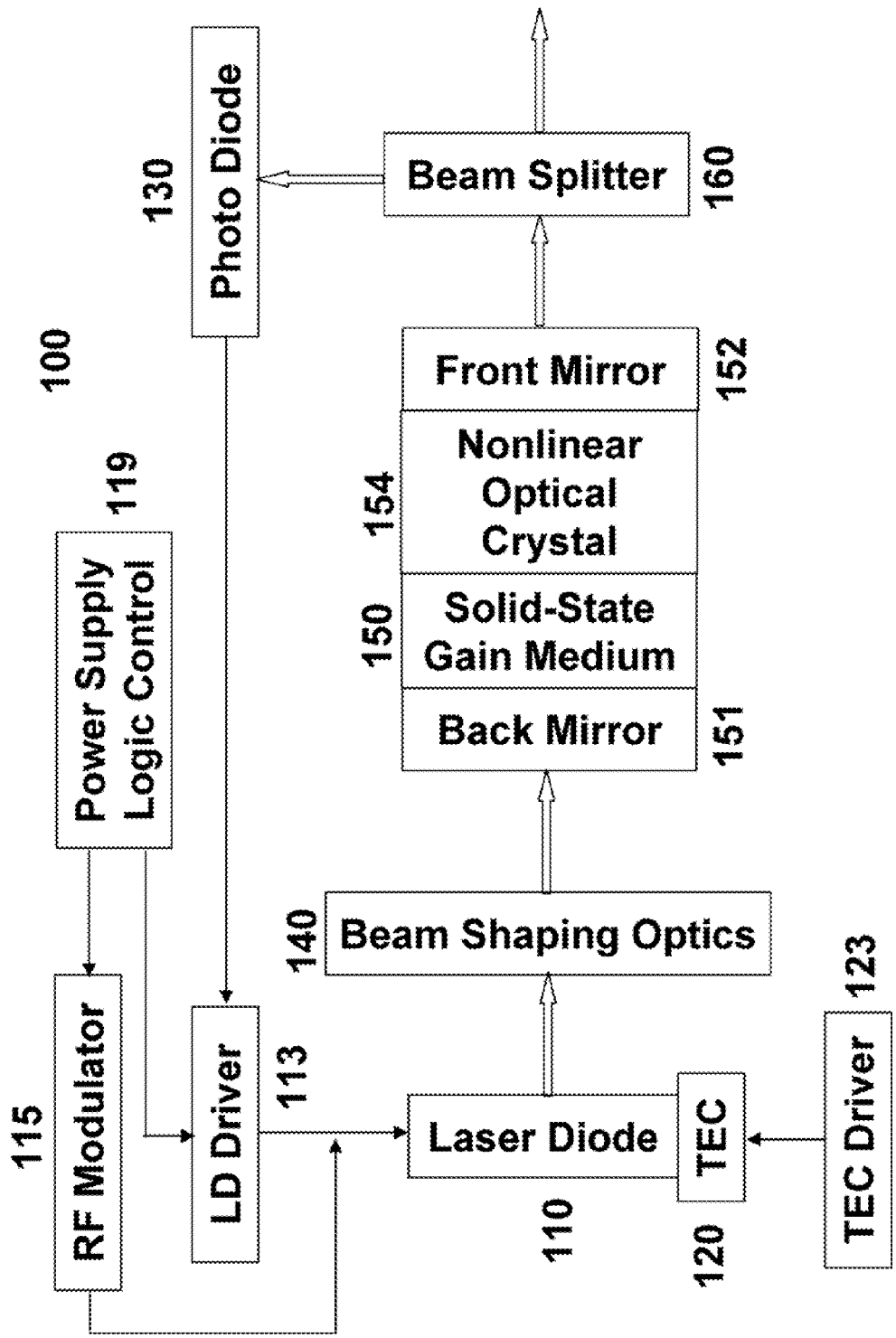
FIG. 1C is a functional block diagram of a diode pumped solid-state laser with one or more nonlinear optical crystal(s) for frequency conversion.

As will be described in more detail hereafter, there is disclosed herein a method and a device for stabilizing the output of a DPSS laser.

Referring to drawings and in particular to FIG. 1A, wherein a functional block diagram of a solid-state laser system constructed in accordance with the present invention is shown. The solid-state laser system 100 consists of a laser diode 110, which is in physical contact with a thermoelectric controller 120 for temperature adjustment and stabilization, a photodiode assembly 130, a beam shaping optics 140, a solid-state gain medium 150, which is placed between a pair of mirrors 151 and 152 to form a laser resonator, and a beam splitter 160. The laser diode 110 is driven by LD driver 113, together with an RF modulator 115. The DC bias generated by the LD driver 113 is superimposed by a high frequency signal generated by the RF modulator 115. With intentional change of the drive current at high frequency, the wavelength of the laser diode output sweeps, resulting in a broadened spectrum. The light emitted from the laser diode 110 is collimated by the beam shaping optics 140 and enters the laser resonator to excite the solid-state laser gain medium 150. The laser resonator is formed between the back mirror 151, which is highly reflective (HR) to the solid-state gain medium emission wavelength and is preferably highly transmissive (HT) to the pump wavelength, and the front mirror 152, which is partially reflective to the solid-state gain medium emission wavelength as output coupler. A fraction of the solid-state laser output is directed to the photodiode 130 via the beam splitter 160. A photon-to-electron conversion device such as photodiode 130 converts the optical signal into electric signal, the latter feeds back to the LD driver 113 for automatic power control. A power supply control 119 provides a logic control for turning on/off DC and RF circuits: enabling the RF oscillator 115 only when the DC generated from 113 is within a predetermined range of values and disabling 115 before the DC generator 113 is turned off. This protects the laser diode 110 from damage due to intolerable back bias. In an alternative embodiment, the pump light enters the solid-state gain medium through the front mirror (output coupler) 152, which is then preferably HT to the pump wavelength. It should be understood by those skilled in the art that more than one laser diode or diode array constructed in accordance with the present invention can be employed as the pump source. In addition to the end pump, the pump light can enter the gain medium transversely (side pump).

FIG. 1B shows another functional block diagram of an inventive solid-state laser system. As shown in this FIG. 1B, the automatic power control system is replaced by a current stabilization unit 118 to keep the DC bias unchanging. According to the present invention, stable DC is obtained with the aid of a current feedback loop. Preferably, the feedback signal is sampled by a current sensing resistor and is compared with a predefined reference in a comparator. Advantageously, the pump light can enter the gain medium through the back mirror 151 or through the front mirror 152. It should be understood by those skilled in the art that more than one laser diode or diode array constructed in accordance with the present invention can be employed as the pump source. In addition to the end pump, the pump light can enter the gain medium transversely (side pump).

FIG. 1C shows a functional block diagram of a solid-state laser system constructed in accordance with the present invention. One or more nonlinear optical crystal(s) are optically bonded onto the solid-state gain medium 150 for intracavity frequency conversion.

FIG. 2A shows a pump light spectrum that matches with the absorption spectrum of laser gain medium, which, in this particular example, is Nd:YAG. Advantageously, the pump light is stabilized in both wavelength and intensity by the inventive method, which comprises (1) appropriate selection of the laser diode case temperature and injection current for best match of the pump light central wavelength with the gain medium absorption peak; (2) automatic temperature control to ensure that the laser diode always operates at the predetermined temperature; (3) RF modulation selectable from waveforms with high duty cycle and optimized degree of modulation; and (4) automatic power control with external photodiode sensor or DC bias stabilization.

FIG. 2B displays the functional relationship between the effective absorption coefficient of the gain medium and deviation of the central wavelength of the pump light spectrum from the gain medium absorption peak. For simplification in calculation, the pump light spectrum is assumed to be Gaussian. By comparing the two curves in the graph, it is clear that the pump light with relatively narrow spectrum (smaller σ) is more sensitive to the mismatch. Wavelength shift can be a consequence of operation temperature change. Laser diodes that are not stabilized by our inventive technology may subject to mode hop, which causes the pump laser wavelength shifts randomly and, as a result, the effective absorption coefficient fluctuates randomly. The pumping noise thus created is then transferred to the solid-state laser, causing unstable operation.

Laser diode noise can also be induced by mode partition. Unlike mode hopping, which causes random wavelength changes, mode partition noise is associated with intensity fluctuations in the longitudinal modes of a laser diode. In the past, investigations into mode partition noise in semiconductor lasers have been driven mainly by applications in telecommunication. It is known that mode partition in semiconductor lasers depends strongly on the dynamics of relaxation oscillation of the longitudinal optical modes. In Fabry-Perot laser devices, strong self-saturation produces mode partition noise with Gaussian distributions, similar to intensity noise distributions from distributed feedback (DFB) devices. Although the total optical output power from the laser may remain constant, the intensity distribution among the longitudinal modes of the laser will fluctuate, as a consequence of random fluctuations in the photon densities of these modes at the moment when the threshold is reached. FIG. 3A shows a laser diode emission spectrum suffering mode partition. For simplicity, only two modes, each of which has a Gaussian distribution, are considered.

In operation, the mode partition noise in the pump laser will be transferred to the laser to be pumped. Plotted in FIG. 3B is the effective absorption coefficient of the gain medium as a function of the intensity ratio of the two modes, again using Nd:YAG as an example.

Unwanted light reflection from optical elements external to the laser cavity, the so-called optical feedback, may disturb laser operation, causing instability. Optical feedback may depopulate certain lasing levels and change the gain threshold, causing intensity fluctuations and/or wavelength shifts. Furthermore, the interference of the feedback light with the resonant cavity primary light may create side bands of the laser emission spectrum. Optical feedback is particularly detrimental to operation of DPSS lasers because of additional optics and transfer of fluctuations in intensity and/or wavelength from the pumping sources to the pumped solid-state lasers. For gain media with narrow absorption bands such as Nd:YAG, the wavelength shift may lead to significant reduction of the excitation energy. Spatially nonuniform excitation may be resulted from the interference between the primary pumping light and the feedback light. Advantageously, these problems can be remedied by implementation of the present invention. By the use of a preferred embodiment shown in FIG. 4, the photo-detector receives only the light from the output coupler. This eliminates the effects from stray light. Moreover, with a drive current, which repeatedly drops below the threshold, the laser is forced to operate in multiple modes with a stable envelope of FWHM≈1 nm. Consequently, the coherence between the feedback light and the cavity primary light collapses and the integrity of the laser spectrum remains.

Figure 4:
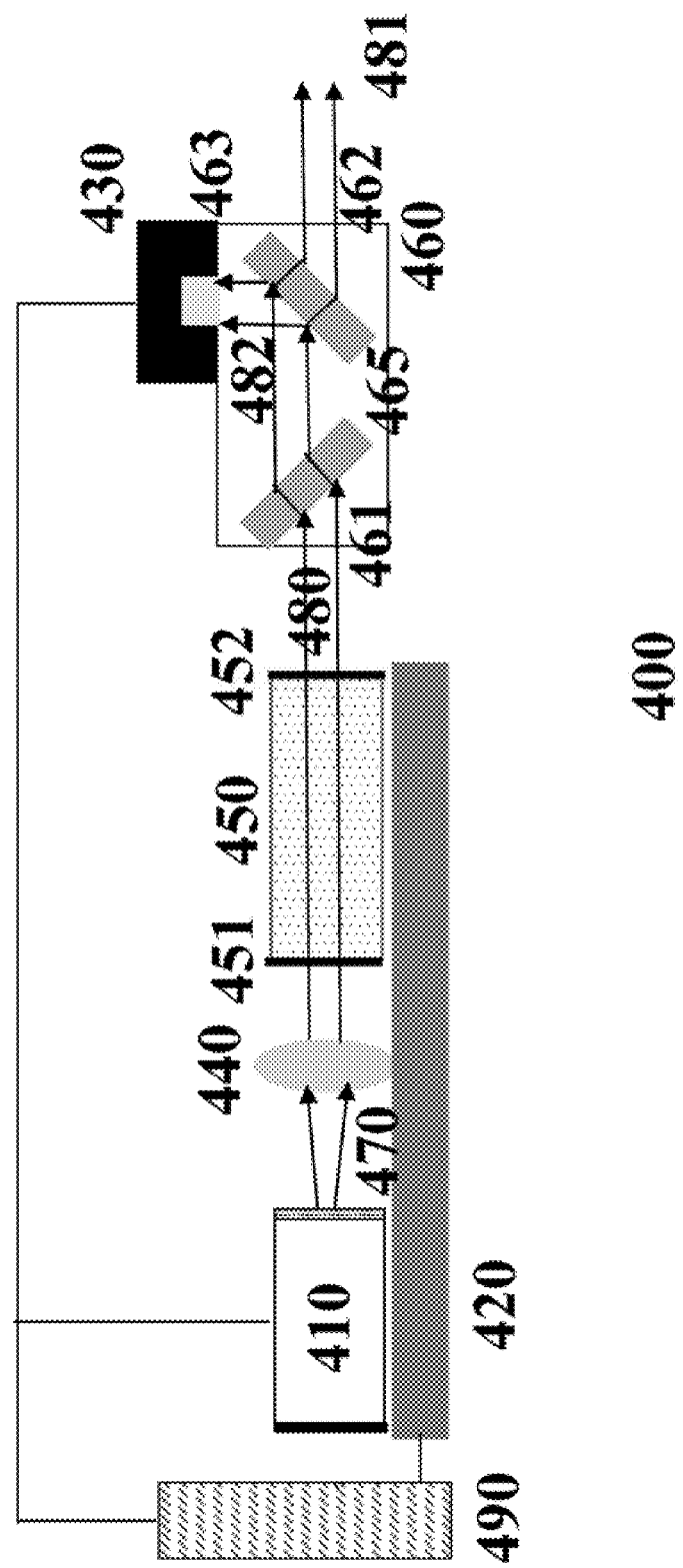
FIG. 4 shows a preferred embodiment of the diode pumped solid-state laser constructed in accordance with our inventive teachings.

In reference to FIG. 4, where a preferred embodiment of the diode pumped solid-state laser 400 constructed in accordance with our inventive teachings is schematically illustrated. The pump diode 410 emits light 470, which, after collimation by the lens 440, enters the solid-state gain medium 450 for optical pumping. The mirrors 451 and 452 form a resonator cavity. In operation, the laser output 480 enters the box 460 through the aperture 461. Contained in the box 460 is the beam splitter 465, which splits the laser beam 480 into two components: the majority of the laser beam 481 is extracted through the aperture 462, while a fraction of the laser beam 482 is directed into the photodiode 430 for monitoring. The photodiode 430 is mounted on the top surface of the box 460 with the aperture 463 facing down towards the box interior. In the photodiode 430, the received optical signal is converted to electrical signal, which is then fed back into the control circuit 490 for automatic power control. The laser diode 410 and the solid-state laser gain medium 450 are physically in contact to a TEC 420 for automatic temperature control. Optionally, the output beam 481 is collimated by a beam shaping optics.

Mathematically, the photodiode current can be expressed as $I_p=\beta\kappa(t_o\Phi+\Delta t_o\Phi)$, where $\kappa$ is the photon-electron conversion efficiency, $t_o$ is the transmissibility of the output coupler 452, $\Delta t_o$ is the transmissibility change due to temperature/wavelength fluctuations, $\Phi$ is the intracavity laser flux, and $\beta$ represents the ratio of the split light 482 to the total laser light 480 extracted from the output coupler 452. Since the photodiode 430 accepts only light representing the actual optical power and is isolated from stray lights, unwanted optical feedback and associated noise are eliminated or greatly reduced. Moreover, the temperature/wavelength stabilization offered by our inventive teachings minimizes the effects of transmissibility fluctuations of the output coupler and the associated noise.

Figure 5A:
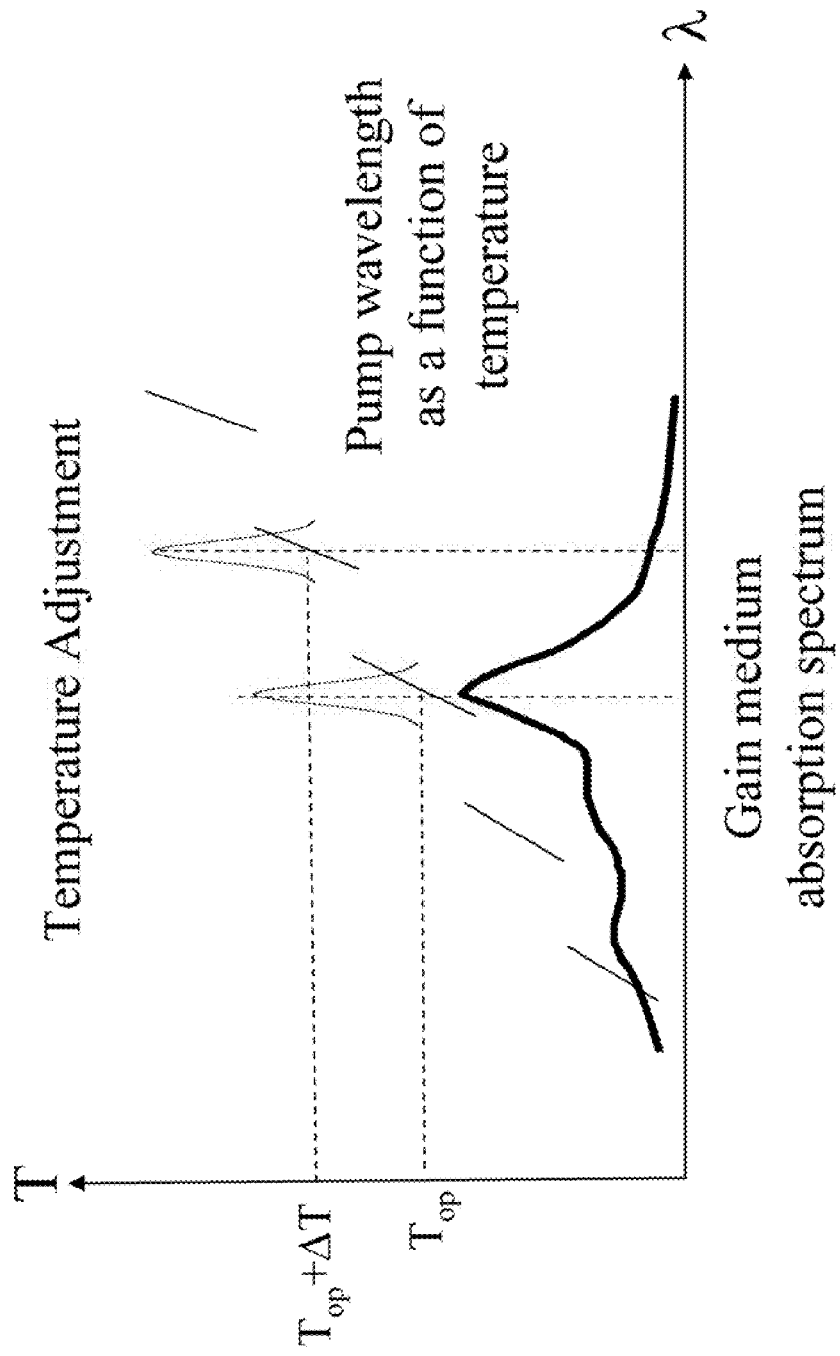
FIG. 5A shows a scheme to optimize the effective absorption of pump energy by adjusting the laser diode operation temperature.

FIG. 5A shows temperature dependence of the pump wavelength. By adjusting the operation temperature, the pump spectrum can move around for best match to the absorption spectrum of the lasing gain medium. For a typical AlGaAs laser, 1° C. temperature change will cause approximately 0.06 nm wavelength shift. Adjusting the operation temperature of a laser diode can be accomplished by, e.g., a thermoelectric controller (TEC).

Figure 5B:
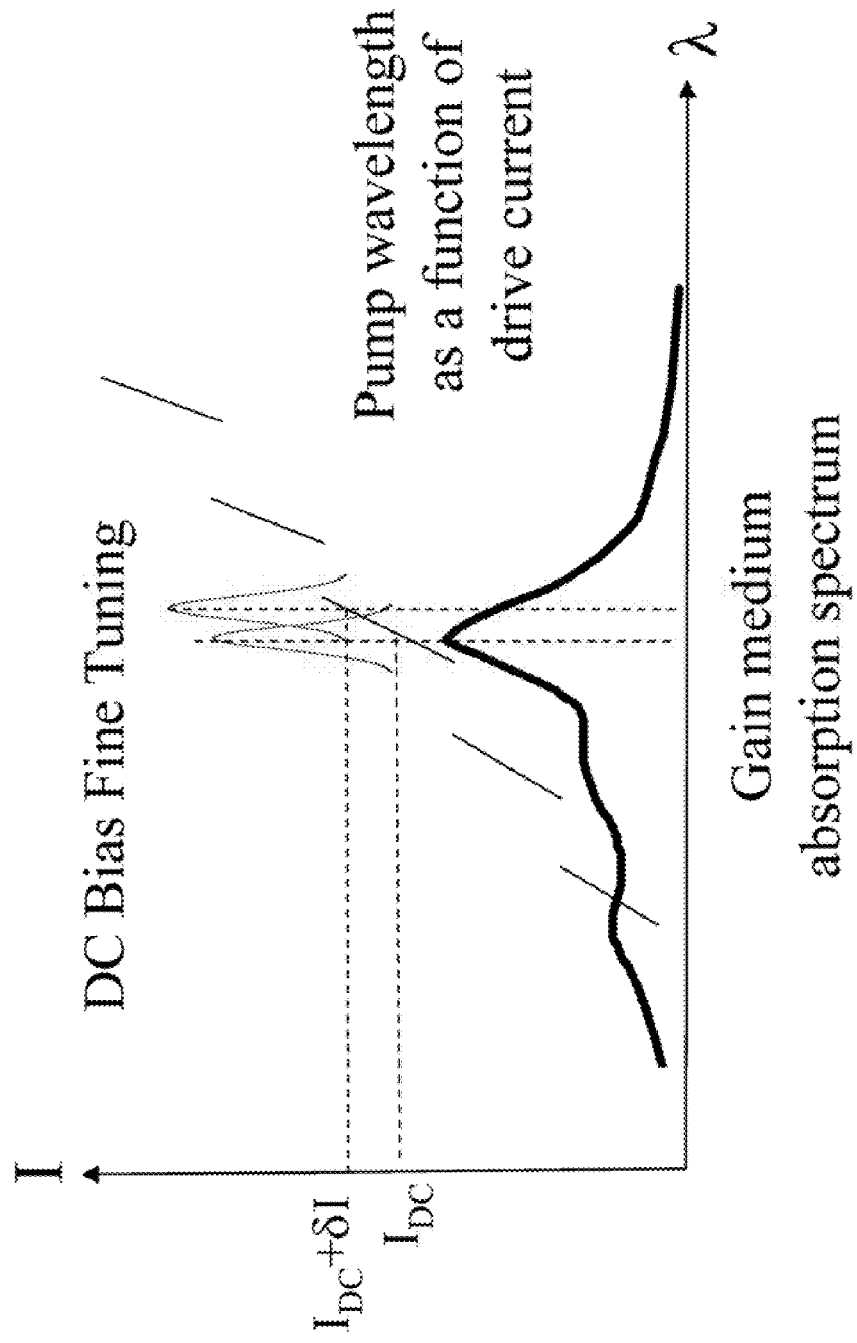
FIG. 5B shows a scheme to optimize the effective absorption of pump energy by adjusting the laser diode DC drive current.

Dependence of the lasing wavelength on the static injection current typically reveals a stair-step pattern, as shown in FIG. 5B. This is attributed to mode hop caused by variations in the optical length and gain profile. For AlGaAs lasers, the slope within each step is in the vicinity of 0.007 nm/mA. From one step to the next, the gap is about 0.25 nm, corresponding to the mode spacing. By changing the injection current at a constant ambient temperature, the wavelength shifts from one longitudinal mode to the next at certain currents, which connect the neighboring steps. Appropriate selection of the static injection current can fine tune the spectral match between the pump emission and the gain medium absorption.

When the drive current varies around the static level at a high frequency, the lasing wavelengths sweep over a narrow range. Averaged over time, the resultant spectrum is stable. Unlike thermal effects, which take place only slowly and are essentially averaged out over high frequency perturbations of the drive current, the field-induced oscillations in the index of refraction and gain profile are characteristic of high frequency and are responsible for the bandwidth of the spectrum. A higher degree of modulation represents a wider spectrum.

One shortcoming of the drive current modulated by a sine waveform, as described in the prior art, is relatively low duty cycle. For laser diodes employed as pump source, a high average drive current is normally required, which may overdrive the laser diode if the duty cycle of the drive current is low. A drive current with high duty cycle such as a rectified sine wave, which can be expressed as $|I_m \sin(\omega t)|+I_{DC}$, where $I_m$ is the amplitude of the RF sine wave, $\omega$ is the frequency, and $I_{DC}$ is the DC bias, is preferred for these applications. As conceptually shown in FIG. 5C, the upper left rectified sine waveform represents a drive current with high degree of modulation, which produces a relatively broad pump light spectrum. On the other hand, the lower left rectified sine waveform represents a drive current with low degree of modulation, which produces a relatively narrow spectrum. By adjusting the degree of modulation, or equivalently, varying the ratio of $I_m$ to $I_{DC}$, we are able to optimize the effective absorption of the lasing gain medium so that the laser efficiency is maximized. Although the waveform shown in this FIG. 5C is a rectified sine, this is by no means of a limitation to the diode drive current. As can be understood by those skilled in the art, other waveforms, preferably having a high duty cycle, can be employed for stabilizing the operation of a solid-state laser within the scope of the present invention.

One important advantage of our inventive teachings is enabling low-noise pulsed operation, which can be Q-switched or gain switched. Advantageously, the pump diode can be operated in continuous wave or pulses generated by internal or external modulation, whether electronically or optically. The pulse width and the repetition rate can vary to meet special requirements of various applications.

Our inventive teachings further enable rapidly pulsed (pulse repetition rate from 1 kHz to several MHz, for example) DPSS lasers, which are increasingly being used in precision micromachining. In some applications, the pulse repetition rate must be variable while the energy per pulse must remain constant as the pulse repetition rate is varied. This requirement cannot be met by a Q-switched laser operating at a repetition rate higher than the reciprocal of the characteristic time of the gain medium, because the energy per pulse then reduces as the repetition rate increases. The present invention successfully addresses this issue.

An example of pulsed operation of a solid-state laser, which produces constant output energy per pulse, is graphically illustrated in FIG. 6. Although the time interval between pulses can vary depending on the needs, the output energy generated in each pulses keeps essentially unchanged. In this FIG. 6, the drive current pulses have a square waveform. This is by no means a limitation to our inventive teachings. As can be appreciated by those skilled in the art, any other waveforms or their combinations can be used to meet special requirements of the applications. It should also be mentioned that the modulated drive current can be a rectified sine wave, or any other waves, preferably having a high duty cycle. Other variations and modifications can be brought into effect within the scope of the invention.

Plotted in FIG. 7A is the power stability test result for a green laser module constructed in accordance with the present invention. As shown in this FIG. 7A, the peak-peak fluctuation of the green (532 nm) laser output power is less than 1% over a temperature cycling in the range of 15° C. to 40° C. FIG. 7B shows that the green laser output remains at low (<0.15%) noise level.

As can be understood by those skilled in the art, our inventive teachings are not limited to DPSS lasers. Other applications whereof the RF modulation stabilized laser diodes are appropriate as primary light sources include frequency conversion, seeding, excitation of fiber media, erbium doped optical amplifier (EDFA), Raman amplifiers, and master oscillator power amplifier (MOPA), to mention a few.

What is claimed is:

1. An efficient and low-noise solid-state laser comprising:
    an optical cavity containing a solid-state laser material, serving as a laser gain medium, at least part of which is population-inversed in response to an excitation, and a pair of resonator mirrors;
    a laser diode serving as a pump source that emits light with an emission spectrum matching the absorption spectrum of the gain medium;
    a set of optical elements for beam shaping so that the beam emitted from the laser diode spatially matches the solid-state laser gain medium;
    a control circuit further comprising a DC generator for generating DC bias and a local oscillator for generating RF signal to modulate the DC bias, the resultant RF modulated drive current energizes said laser diode,
    whereby the laser operation is repetitively on-off or is continuously perturbed,
    whereby the output spectrum of the laser diode is stable,
    whereby the laser gain medium is stably excited and the output power of the solid-state laser monotonically changes with the DC bias of the laser diode drive current;
    one or more automatic temperature controller(s) affixed to said laser diode, and to said solid-state laser material, for active temperature control such that the temperature of the laser diode and the solid-state laser gain medium can be controlled dependently or independently; and
    an automatic power control loop for adjusting drive current DC bias to maintain output power of the solid-state laser at a predetermined level;
    wherein said automatic power control loop further comprising:
        a photon-to-electron conversion device for detecting the solid-state laser output power and for providing a feedback signal to laser diode drive circuit in response to drift in the solid-state laser output power,
        a beam splitter for dividing the solid-state laser output into two portions and delivering a fraction of laser light into said photon-to-electron conversion device,
        a feedback loop including an amplifier for amplifying the feedback signal,
        a reference voltage predetermined according to the initial value of the solid-state laser output power,
        a comparator that compares the fed back signal with the reference voltage and adjusts the drive current DC bias according to the comparison result;
    wherein: said photon-to-electron conversion device is external to the solid-state laser system: it exposes only to the interior of a sealed box so designed that said photon-to-electron conversion device only accepts light split from the solid-state laser output beam, stray light is completely isolated;
    wherein: said solid-state laser includes fiber laser.

2. An efficient and low-noise solid-state laser as of claim 1, wherein:
    said laser diode is operated at a predetermined temperature;
    the operation temperature of the laser diode is so adjusted that the diode emission spectrum matches the gain medium absorption spectrum with maximized effective absorption.

3. An efficient and low-noise solid-state laser as of claim 1, wherein:
    the waveform of the RF modulated drive current and the degree of modulation are so selected/adjusted that the emission spectrum of the laser diode best matches the gain medium absorption spectrum.

4. An efficient and low-noise solid-state laser as of claim 1, wherein:
said RF signal is a sine wave or a distorted sine wave or a rectified sine wave or a non-sine wave.

5. An efficient and low-noise solid-state laser as of claim 1, further comprising:
one or more laser diode(s), each is energized by an RF modulated drive current to produce stabilized beam for optically pumping the solid-state laser gain medium, configured with end-pumping or side-pumping or a combination thereof;
these laser diode(s) can be operated simultaneously or sequentially or in any other modes.

6. An efficient and low-noise solid-state laser as of claim 1, further comprising:
one or more nonlinear optical crystal(s) that are optically bonded to the gain medium and are disposed within the optical cavity between the two resonator mirrors for intracavity nonlinear frequency conversion.

7. An efficient and low-noise solid-state laser as of claim 1, wherein:
said laser diode operates in a pulsed mode;
pulsed laser operation is achieved by external or internal modulation, electrically or optically; such that
pulse shape, width, and repetition rate are variable.

8. An efficient and low-noise solid-state laser as of claim 1, wherein:
the solid-state laser operates in rapidly pulsed mode via Q-switching or gain switching.

9. An efficient and low-noise solid-state laser amplifier comprising:
a solid-state laser material, serving as a laser gain medium, at least part of which is population-inversed in response to an excitation, whereby a gain profile is generated;
an input laser beam with a spectrum matching the gain profile of the laser gain medium;
one or more laser diode(s), serving as pump source to emit pump beam with emission spectrum matching the absorption spectrum of said laser gain medium;
a set of optical elements for beam shaping so that the pump beam spatially matches the solid-state laser gain medium;
a control circuit further comprising a DC generator for generating DC bias and a local oscillator for generating RF signal to modulate the DC bias, the resultant RF modulated drive current energizes each laser diode,
whereby the laser operation is repetitively on-off or is continuously perturbed,
whereby the output spectrum of the laser diode(s) is stable,
whereby the laser gain medium is stably excited and the output power of the solid-state laser monotonically changes with the DC bias of the laser diode drive current; and
one or more automatic temperature controller(s) in physical contact to the laser diode(s), and to the laser material, for active temperature control such that the temperature of the laser diode(s) and the solid-state laser material can be controlled dependently or independently;
wherein: said solid-state laser amplifier includes fiber amplifier.

10. An efficient and low-noise solid-state laser amplifier as of claim 9 further comprising:
an automatic power control loop for adjusting the DC bias of the diode drive current to maintain output power of the solid-state laser amplifier at a predetermined level further comprising:
a photon-to-electron conversion device for detecting laser amplifier output power and providing a feedback signal to laser diode drive circuit in response to drift in solid-state laser amplifier output power,
a beam splitter for dividing laser output into two portions and delivering a fraction of laser light into said photon-to-electron conversion device,
a feedback loop including an amplifier for amplifying feedback signal,
a reference voltage predetermined according to the initial value of the amplifier output power, and
a comparator that compares the feedback signal with the reference voltage and adjusts the drive current DC bias according to the comparison result;
wherein: said photon-to-electron conversion device is external to the solid-state laser amplifier system: it exposes only to the interior of a sealed box so designed that said photon-to-electron conversion device only accepts light split from the solid-state laser amplifier output beam, stray light is completely isolated.

11. An efficient and low-noise solid-state laser amplifier as of claim 9, wherein:
the laser amplifier is a power amplifier and the input laser beam is produced from a master oscillator.

12. An efficient and low-noise solid-state laser as of claim 1, wherein:
the resonator mirrors are dielectric coatings on the two end faces of the laser material to form a monolithic structure.

13. A method for reducing noise and stabilizing solid-state laser output comprising steps of:
selecting a laser diode that emits light with an emission spectrum matching the absorption spectrum of the solid-state laser gain medium;
periodically disturbing the laser diode operation in a timeframe shorter than the buildup time of the longitudinal modes in the laser diode by intentional change of the drive current in accordance with a pattern constituted by a combination of the parameters including waveform, frequency, amplitude, and duty cycle, whereby optical noise associated with mode hop and mode partition are eliminated or reduced;
employing the laser diode as a pump source to irradiate the laser gain medium;
selecting the operation temperature of the laser diode such that its emitting wavelength coincides or nearly coincides with the wavelength where the laser gain medium has a maximum absorption to the light irradiating it;
selecting the average value of the laser diode drive current such that it creates a substantial population inversion in the laser gain medium;
actively controlling the operation temperature of the laser diode and actively controlling the temperature of the laser gain medium to maintain the match between the emission spectrum of the laser diode and the absorption spectrum of the laser gain medium; and
actively controlling the laser diode drive current DC bias to stabilize the output power of the solid-state laser, further comprises steps of:
directing a fraction of the solid-state laser output into a photon-to-electron conversion device, which is external to the optical cavity of the solid-state laser and is isolated from stray light, wherein the photon-to-electron conversion device responds only to low-frequency signals;

converting the received optical signal into electrical signal;

sending the converted electrical signal to a feedback loop;

enhancing detecting sensitivity of the photon-to-electron conversion device by amplifying the electrical signal in the feedback loop;

comparing the feedback signal with a predefined reference in comparator; and adjusting the DC bias according to the comparison results.

14. A method for reducing noise and stabilizing solid-state laser output as of claim 13, further comprising steps of:

shaping the optical beam(s) emitted from one or more laser diode(s) configured for end pumping or side pumping or a combination thereof such that the optical beam(s) spatially match the solid-state laser gain medium.

15. A method for reducing noise and stabilizing solid-state laser output as of claim 13 wherein:

periodically disturbing the laser diode operation further comprising steps of:

generating a DC bias from a DC generator;

generating an RF signal from an RF generator;

superimposing the DC bias and the RF signal to generate an RF modulated drive current; and injecting the RF modulated drive current into the laser diode.

16. A method for reducing noise and stabilizing solid-state laser output as of claim 13 further comprising steps of:

modulating the drive current amplitude internally or externally, electrically or optically, to obtain pulsed pump light such that the pulse shape, width, repetition rate, and the pulse-to-pulse interval are variable.

17. A method for reducing noise and stabilizing solid-state laser output as of claim 16 further comprising steps of:

generating output pulses of the solid-state laser via gain switching such that essentially constant energy per pulse is produced regardless of the pulse-to-pulse interval.

18. An efficient and low-noise solid-state laser amplifier as of claim 9, wherein:

the laser amplifier is a Raman amplifier.

* * * * *